United States Patent
Nagami

(10) Patent No.: US 10,176,971 B2
(45) Date of Patent: *Jan. 8, 2019

(54) PLASMA PROCESSING APPARATUS

(71) Applicant: Tokyo Electron Limited, Tokyo (JP)

(72) Inventor: Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/905,908

(22) Filed: Feb. 27, 2018

(65) Prior Publication Data

US 2018/0190474 A1    Jul. 5, 2018

Related U.S. Application Data

(63) Continuation of application No. 15/464,539, filed on Mar. 21, 2017, now Pat. No. 9,941,098.

(30) Foreign Application Priority Data

Mar. 22, 2016   (JP) .................. 2016-056942

(51) Int. Cl.
    *H01J 7/24*     (2006.01)
    *H01J 37/32*    (2006.01)

(52) U.S. Cl.
    CPC .. *H01J 37/32174* (2013.01); *H01J 37/32091* (2013.01); *H01J 37/32165* (2013.01); *H01J 37/32183* (2013.01); *H01J 37/32449* (2013.01); *H01J 37/32577* (2013.01)

(58) Field of Classification Search
    CPC ........... H01J 37/32082; H01J 37/32091; H01J 37/32165; H01J 37/32174; H01J 37/32183

USPC .................................................. 315/111.21
See application file for complete search history.

(56) References Cited

U.S. PATENT DOCUMENTS

| | | | |
|---|---|---|---|
| 5,689,215 A | 11/1997 | Richardson | |
| 5,793,162 A | 8/1998 | Barnes | |
| 8,018,164 B2 | 9/2011 | Shannon | |
| 8,264,154 B2 * | 9/2012 | Banner | H01J 37/321 315/111.71 |

(Continued)

FOREIGN PATENT DOCUMENTS

| | | | |
|---|---|---|---|
| JP | 2010-510669 A | 4/2010 | |
| JP | 2013-058749 A | 3/2013 | |

(Continued)

*Primary Examiner* — Tung X Le
(74) *Attorney, Agent, or Firm* — Pearn & Gordon LLP

(57) ABSTRACT

In a plasma processing apparatus, an operation unit configured to calculate a parameter including any one of a load impedance, a load resistance and a load reactance of a high frequency power supply and a reflection wave coefficient of a high frequency power, and a controller configured to sequentially perform multiple cycles, each having plural stages which are performed in sequence. The controller is configured to control a setting of the high frequency power supplied to an electrode to be changed at a time point when the parameter exceeds a threshold value after a processing gas is changed. The changing of the setting of the high frequency power includes changing a power level of the high frequency power and/or changing the high frequency power from one of a continuous wave and a pulse-modulated high frequency power to the other thereof.

14 Claims, 9 Drawing Sheets

(56) References Cited

U.S. PATENT DOCUMENTS

| | | | |
|---|---|---|---|
| 9,171,699 B2* | 10/2015 | Valcore, Jr. | H01J 37/32082 |
| 9,640,368 B2 | 5/2017 | Umehara | |
| 2005/0093459 A1 | 5/2005 | Kishinevsky | |
| 2009/0295296 A1 | 12/2009 | Shannon | |
| 2010/0099266 A1* | 4/2010 | Oswald | H01J 37/32009 |
| | | | 438/719 |
| 2011/0031216 A1* | 2/2011 | Liao | H01J 37/32082 |
| | | | 216/67 |
| 2011/0137446 A1* | 6/2011 | Valcore, Jr. | H01J 37/32082 |
| | | | 700/108 |
| 2013/0214683 A1 | 8/2013 | Valcore | |
| 2016/0126069 A1 | 5/2016 | Kwon | |
| 2017/0294293 A1* | 10/2017 | Howald | H01J 37/32926 |
| 2018/0077788 A1* | 3/2018 | Van Zyl | H01J 37/32935 |

FOREIGN PATENT DOCUMENTS

| | | |
|---|---|---|
| JP | 2016-092342 A | 5/2016 |
| WO | 2008/061069 A1 | 5/2008 |

* cited by examiner

PLASMA PROCESSING APPARATUS

CROSS-REFERENCE TO RELATED APPLICATION

This is a continuing application of U.S. patent application Ser. No. 15/464,539, filed on Mar. 21, 2017 which claims the benefit of Japanese Patent Application No. 2016-056942 filed on Mar. 22, 2016, the entire disclosures of which are incorporated herein by reference.

TECHNICAL FIELD

The embodiments described herein pertain generally to a plasma processing apparatus for processing a processing target object.

BACKGROUND

In the manufacture of an electronic device such as a semiconductor device, a plasma processing is performed on a processing target object by using a plasma processing apparatus. In general, the plasma processing apparatus includes a processing vessel, a gas supply system, a first electrode, a second electrode and a high frequency power supply. The gas supply system is configured to supply a processing gas into the processing vessel. The first electrode and the second electrode are disposed with a space within the processing vessel therebetween. The high frequency power supply is configured to supply a high frequency power to either one of the first electrode and the second electrode. Generally, in the plasma processing performed in this plasma processing apparatus, the processing gas is supplied into the processing vessel from the gas supply system, and the high frequency power from the high frequency power supply is supplied to either one of the first electrode and the second electrode.

There may be a plasma processing in which two separate stages of generating plasma of different processing gases are performed alternately. In this kind of plasma processing, when transitioning from a preceding stage to a succeeding stage, the processing gas supplied from the gas supply system is changed, and a setting of the high frequency power is changed.

Since a gas has a mass, there is required a time period from a time point when the processing gas supplied from the gas supply system is changed to a time point when the processing gas within the processing vessel is actually changed. Meanwhile, the high frequency power whose setting has been changed is supplied to either one of the electrodes nearly without delay. Accordingly, it happens that the high frequency power whose setting has been changed is supplied to either one of the electrodes before the processing gas within the processing vessel is changed.

As a resolution, there is proposed a technique in which a supply of the high frequency power to the electrode is begun after it is confirmed from a detection result of an emission spectrum within the processing vessel that a processing gas for a succeeding stage has reached the processing vessel. This technique is described in Patent Document 1.

Patent Document 1: Japanese Patent Laid-open Publication No. 2013-058749

However, there may be no detectable difference between an emission spectrum of plasma of a processing gas used in a preceding stage and an emission spectrum of plasma of a processing gas used in a succeeding stage. In such a case, it may be difficult to accurately detect a time point when the processing gas is changed within the processing vessel. As a result, the setting of the high frequency power cannot be changed at an appropriate timing.

Further, the plasma processing apparatus may be additionally equipped with a DC power supply connected to the first electrode. The DC power supply is configured to apply a negative DC voltage to the first electrode. In a plasma processing using this plasma processing apparatus, a level of the DC voltage output from the DC power supply may be changed when transitioning from a preceding stage to a succeeding stage. In this plasma processing as well, the level of the DC voltage may not be changed at an appropriate timing.

Thus, in a plasma processing method of sequentially performing multiple cycles, each of which includes plural stages which generate plasma of different processing gases within the processing vessel and which are performed in sequence, it is required to change the setting of the high frequency power and/or the setting of the level of the DC voltage at appropriate timings after transitioning from the preceding stage to the succeeding stage.

SUMMARY

In one exemplary embodiment, there is provided a plasma processing apparatus for performing a plasma processing method. The plasma processing apparatus includes: a processing vessel; a gas supply system configured to supply a gas into the processing vessel; a first electrode and a second electrode arranged with a space within the processing vessel therebetween; a high frequency power supply configured to output a high frequency power; a power feed line configured to connect the high frequency power supply to either one electrode of the first electrode and the second electrode; a matching device configured to adjust a load impedance of the high frequency power supply; an operation unit configured to calculate a parameter including any one of the load impedance, a load resistance and a load reactance of the high frequency power supply and a reflection wave coefficient of the high frequency power; and a controller configured to sequentially perform multiple cycles, each having plural stages which generate plasma of different processing gases within the processing vessel and which are performed in sequence. The controller is further configured to control: the high frequency power to be supplied to the either one electrode from the high frequency power supply over the plural stages; the processing gas output from the gas supply system to be changed when transitioning from a preceding stage in the plural stages to a succeeding stage which continues to the preceding stage; and a setting of the high frequency power supplied to the either one electrode from the high frequency power supply to be changed at a time point when the parameter exceeds a threshold value after the processing gas output from the gas supply system is changed. The changing of the setting of the high frequency power includes changing a power level of the high frequency power and/or changing the high frequency power, which is supplied to the either one electrode from the high frequency power supply, from one of a continuous wave and a pulse-modulated high frequency power to the other thereof.

In another exemplary embodiment, there is provided a plasma processing apparatus for performing a plasma processing method. The plasma processing apparatus includes: a processing vessel; a gas supply system configured to supply a gas into the processing vessel; a first electrode and a second electrode arranged with a space within the processing vessel therebetween; a high frequency power supply configured to output a high frequency power; a power feed line configured to connect the high frequency power supply to either one electrode of the first electrode and the second electrode; a matching device configured to adjust a load impedance of the high frequency power supply; a DC power supply connected to the first electrode and configured to generate a negative DC voltage; an operation unit configured to calculate a parameter including any one of the load impedance, a load resistance of and a load reactance of the high frequency power supply and a reflection wave coefficient of the high frequency power; and a controller configured to sequentially perform multiple cycles, each having plural stages which generate plasma of different processing gases within the processing vessel and which are performed in sequence. The controller is further configured to control: the high frequency power to be supplied to the either one electrode from the high frequency power supply over the plural stages; the processing gas output from the gas supply system to be changed when transitioning from a preceding stage in the plural stages to a succeeding stage which continues to the preceding stage; and at least one of a setting of the high frequency power supplied to the either one electrode from the high frequency power supply and a level of the DC voltage output by the DC power supply to be changed at a time point when the parameter exceeds a threshold value after the processing gas output from the gas supply system is changed. The changing of the setting of the high frequency power includes changing a power level of the high frequency power and/or changing the high frequency power, which is supplied to the either one electrode from the high frequency power supply, from one of a continuous wave and a pulse-modulated high frequency power to the other thereof.

The plasma processing apparatus according to the present exemplary embodiment further includes a time adjusting unit. The time adjusting unit is configured to: calculate a time difference from when transitioning to the succeeding stage to the time point when the parameter exceeds the threshold value; and adjust a length of a preset processing time of the same stage as the succeeding stage in a cycle performed after a preceding cycle in the multiple cycles to be increased by the time difference obtained in the preceding cycle in the multiple cycles.

In the plasma processing apparatus according to the present exemplary embodiment, the operation unit is further configured to adjust the threshold value by using a moving average value calculated from a series of parameter. In the plasma processing apparatus according to the present exemplary embodiment, the series of parameter includes the parameter including any one of the load impedance, the load resistance and the load reactance of the high frequency power supply and the reflection wave coefficient of the high frequency power in a state that impedance matching by the matching device is completed in the same stage as the succeeding stage of the previously completed cycle in the multiple cycles or in each of the succeeding stage and the same stage as the succeeding stage of the previously completed cycle in the multiple cycles.

In the plasma processing apparatus according to the present exemplary embodiment, the plural stages includes: a first stage of generating plasma of a first processing gas containing a rare gas and a fluorocarbon gas; and a second stage of generating plasma of a second processing gas containing a rare gas, the second stage being performed subsequent to the first stage. The plural stages further includes: a third stage of generating plasma of a third processing gas containing a rare gas and an oxygen gas, the third stage being performed subsequent to the second stage.

In the plasma processing apparatus according to the present exemplary embodiment, each of the plural stages includes: a first sub-period which is a period ranging from the time point when the setting of the high frequency power or the level of the DC voltage is changed to a certain time point within a processing time of the each stage; and a second sub-period which is a period ranging from the certain time point to an end of the time point of the processing time of the each stage. In the present exemplary embodiment, the plasma processing apparatus further includes an impedance sensor configured to calculate a first moving average value which is a moving average value of the load impedance of the high frequency power supply in the first-sub period, and a second moving average value which is a moving average value of the load impedance of the high frequency power supply in the second-period.

In the present exemplary embodiment, the controller is further configured to determine whether the first and second moving average values are within a preset control range. The preset control range is a range in which the load impedance of the high frequency power supply is matched with a matching point through a control of a frequency of the high frequency power. If the first and second moving average values are within a preset control range, the controller is further configured to set the frequency of the high frequency power for each of the first and second sub-period such that the load impedance of the high frequency power supply in the first sub-period estimated from the first moving average value and the load impedance of the high frequency power supply in the second sub-period estimated from the second moving average value approximate to the matching point. In this case, the controller is further configured to set the power level of the high frequency power in the first and second sub-periods after setting the frequency of the high frequency power for each of the first and second sub-period. Furthermore, the controller is configured to control the power level of the high frequency power in the first sub-period is higher than the power level of the high frequency power in the second sub-period. Meanwhile, if the first and second moving average values are not within a preset control range, the controller is further configured to adjust the matching device such that the load impedance of the high frequency power supply approximates to the matching point.

As stated above, in the plasma processing apparatus of sequentially performing the multiple cycles, each of which includes the plural stages which generate the plasma of the different processing gases within the processing vessel and which are performed in sequence, it is possible to change the setting of the high frequency power and/or the setting of the level of the DC voltage at appropriate timings after transitioning from the preceding stage to the succeeding stage.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
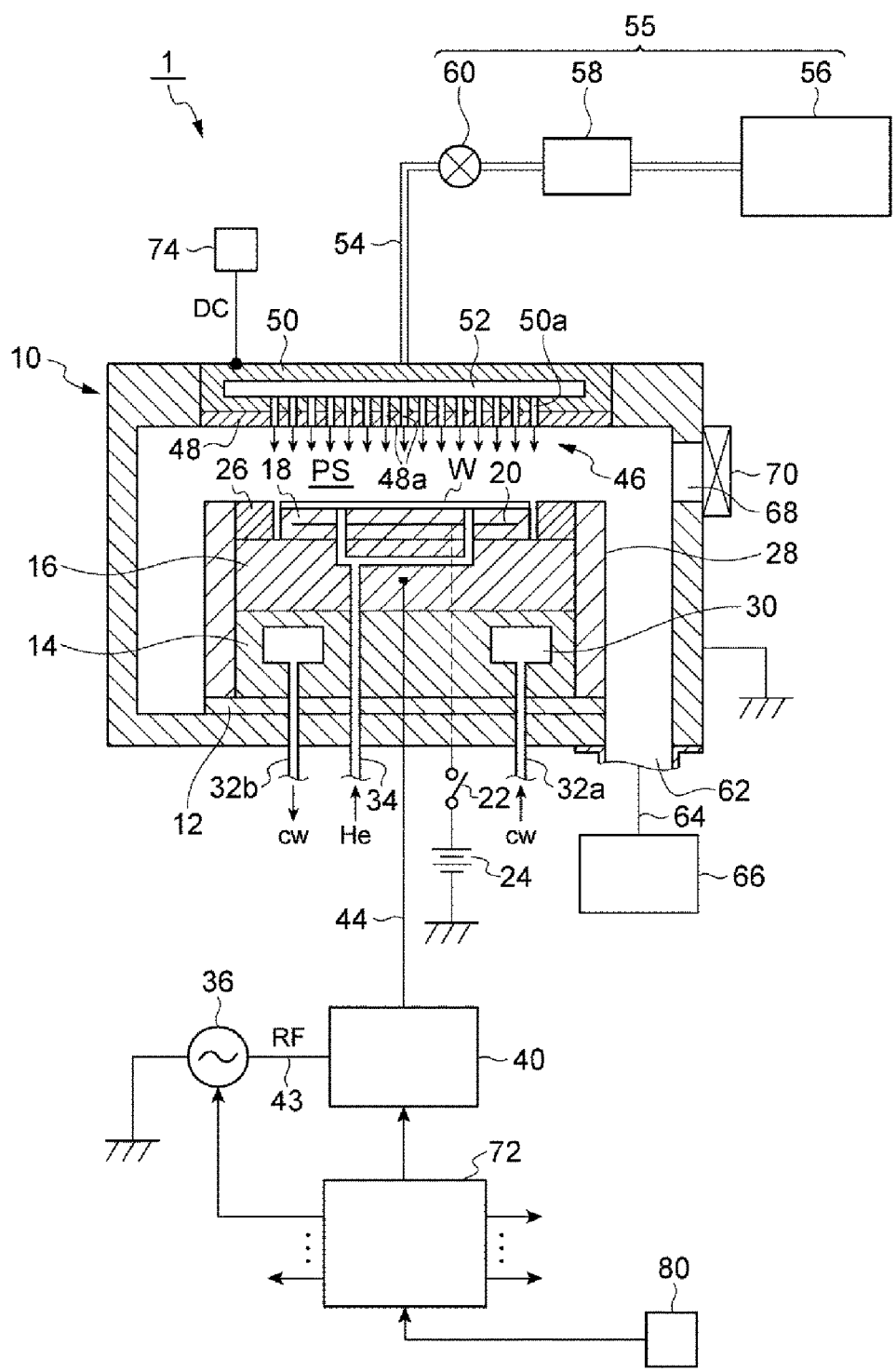
FIG. 1 is a diagram schematically illustrating a configuration of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First, a plasma processing apparatus capable of performing a plasma processing method according to an exemplary embodiment will be described. FIG. 1 is a diagram schematically illustrating a configuration of a plasma processing apparatus according to an exemplary embodiment. The plasma processing apparatus 1 shown in FIG. 1 is configured as a capacitively coupled plasma processing apparatus. The plasma processing apparatus 1 includes a processing vessel 10. The processing vessel 10 has a substantially cylindrical shape, and is made of a material such as aluminum. An inner wall surface of the processing vessel 10 is anodically oxidized. The processing vessel 10 is grounded.

An insulating plate 12 is provided at a bottom portion of the processing vessel 10. The insulating plate 12 is made of, by way of non-limiting example, ceramic. A supporting table 14 is provided on the insulating plate 12. The supporting table 14 has a substantially circular column shape, and a susceptor 16 is provided on the supporting table 14. The susceptor 16 is made of a conductive material such as aluminum, and is configured as a lower electrode (second electrode).

An electrostatic chuck 18 is provided on the susceptor 16. The electrostatic chuck 18 has a structure in which an electrode 20 made of a conductive film is embedded between insulating layers or between insulating sheets. The electrode 20 of the electrostatic chuck 18 is electrically connected to a DC power supply 24 via a switch 22. The electrostatic chuck 18 is configured to generate an electrostatic attracting force by a DC voltage applied from the DC power supply 24, and hold a processing target object W thereon by this electrostatic attracting force. The processing target object W may be a disk-shaped object such as a wafer. A focus ring 26 is disposed on the susceptor 16 to surround the electrostatic chuck 18. Further, a cylindrical inner wall member 28 is disposed on side surfaces of the susceptor 16 and the supporting table 14. This inner wall member 28 is made of, but not limited to, quartz.

A coolant path 30 is formed within the supporting table 14. For example, the coolant path 30 is extended in a spiral shape around a central axis line which is extended in a vertical direction. A coolant cw (for example, cooling water) is supplied through a pipeline 32a into the coolant path 30 from a chiller unit provided at the outside of the processing vessel 10. The coolant supplied into the coolant path 30 is then returned back into the chiller unit via a pipeline 32b. By adjusting a temperature of the coolant through the chiller unit, a temperature of the processing target object W can be adjusted. Further, in the plasma processing apparatus 1, a heat transfer gas (e.g., a He gas) supplied through a gas supply line 34 is introduced into a gap between a top surface of the electrostatic chuck 18 and a rear surface of the processing target object W.

A conductor 44 (for example, a power feed rod) is connected to the susceptor 16. A high frequency power supply 36 is connected to the conductor 44 via a matching device 40. The high frequency power supply 36 is configured to generate a high frequency power RF for plasma generation. The matching device 40 and the conductor 44 constitute a part of a power feed line 43 configured to transmit the high frequency power RF from the high frequency power supply 36 to the susceptor 16. A basic frequency $f_B$ of the high frequency power RF output from the high frequency power supply 36 is in a range from, but not limited to, 2 MHz to 100 MHz.

An upper electrode 46 is provided at a ceiling portion of the processing vessel 10. A processing space PS, in which plasma is generated, within the processing vessel 10 is formed between the upper electrode 46 and the susceptor 16. In the exemplary embodiment, a DC power supply 74 is connected to the upper electrode 46. The DC power supply 74 is configured to apply a negative DC voltage DC to the upper electrode 46. The upper electrode 46 has a ceiling plate 48 and a supporting body 50. The ceiling plate 48 is provided with a multiple number of gas discharge holes 48a. The ceiling plate 48 is made of a silicon-based material such as, but not limited to, Si or SiC. The supporting body 50 is a member which supports the ceiling plate 48 in a detachable manner and is made of aluminium. A surface of the supporting body 50 is anodically oxidized.

A gas buffer room 52 is provided within the supporting body 50. Further, the supporting body 50 is provided with a multiple number of gas through holes 50a. The gas through holes 50a are extended from the gas buffer room 52 and communicated with the gas discharge holes 48a, respectively. The gas buffer room 52 is connected with a gas supply system 55 via a gas supply line 54. The gas supply system 55 includes a gas source group 56, a flow rate controller group 58 and a valve group 60. The gas source group 56 includes a plurality of gas sources. The flow rate controller group 58 includes a multiple number of flow rate controllers. Here, the flow rate controllers may be implemented by, by way of non-limiting example, mass flow controllers. Further, the valve group 60 includes a multiple number of valves. Each of the plurality of gas sources of the gas source group 56 is connected to the gas supply line 54 via each corresponding flow rate controller of the flow rate controller group 58 and each corresponding valve of the valve group 60. The gas supply system 55 is configured to supply a gas from a gas source selected from the plurality of gas sources into the gas buffer room 52 at a controlled flow rate. The gas introduced into the gas buffer room 52 is discharged into the processing space PS through the gas discharge holes 48a.

When viewed from the top, an annular space is formed between the susceptor 16 and a sidewall of the processing vessel 10 and between the supporting table 14 and the sidewall of the processing vessel 10. A bottom portion of the corresponding space is connected to an exhaust opening 62 of the processing vessel 10. An exhaust line 64 communicating with the exhaust opening 62 is connected to a bottom portion of the processing vessel 10. The exhaust line 64 is connected to an exhaust device 66. The exhaust device 66 is equipped with a vacuum pump such as a turbo molecular pump, and is configured to decompress the internal space of the processing vessel 10 to a required pressure level. Further, an opening 68 for carry-in/out of the processing target object W is formed at the sidewall of the processing vessel 10. A gate valve 70 for opening/closing the opening 68 is provided at the sidewall of the processing vessel 10.

Further, the plasma processing apparatus 1 is equipped with a main controller 72. The main controller 72 includes one or more microcomputers. The main controller 72 controls operations of individual components of the plasma processing apparatus 1, e.g., the high frequency power supply 36, the matching device 40, the DC power supply 74, the gas supply system 55 (i.e., the multiple number of flow rate controllers of the flow rate controller group 58 and the multiple number of valves of the valve group 60) and the exhaust device 66, and controls an overall operation of the plasma processing apparatus 1 according to software (programs) and recipe stored in an external memory or an internal memory. Further, the main controller 72 is connected with a manipulation panel for man-machine interface including an input device such as a keyboard and a display device such as a liquid crystal display, and an external memory device configured to store various programs and various data such as recipes and setting values.

A basic operation of the plasma processing apparatus 1 is performed as follows. First, the gate valve 70 is opened, and the processing target object W is carried into the processing vessel 10 through the opening 68. The processing target object W carried into the processing vessel 10 is placed on the electrostatic chuck 18. Then, a gas is introduced into the processing vessel 10 from the gas supply system 55, and the exhaust device 66 is operated so that a pressure in the internal space of the processing vessel 10 is set to a preset pressure value. Further, the high frequency power RF from the high frequency power supply 36 is supplied to the susceptor 16. Further, the DC voltage DC from the DC power supply 74 is applied to the upper electrode 46 when necessary. Further, the DC voltage from the DC power supply 24 is applied to the electrode 20 of the electrostatic chuck 18, so that the processing target object W is held on the electrostatic chuck 18. The gas supplied into the processing vessel 10 is excited by high frequency electric field generated between the susceptor 16 and the upper electrode 46. As a result, plasma is generated. The processing target object W is processed by radicals and/or ions from the generated plasma. In addition, in case that the DC voltage DC from the DC power supply 74 is applied to the upper electrode 46, positive ions are attracted to the upper electrode 46 and collide with the upper electrode 46. As a result, secondary electrons are emitted from the upper electrode 46, and/or a material that forms the upper electrode 46, for example, silicon is released from the upper electrode 46.

Figure 2:
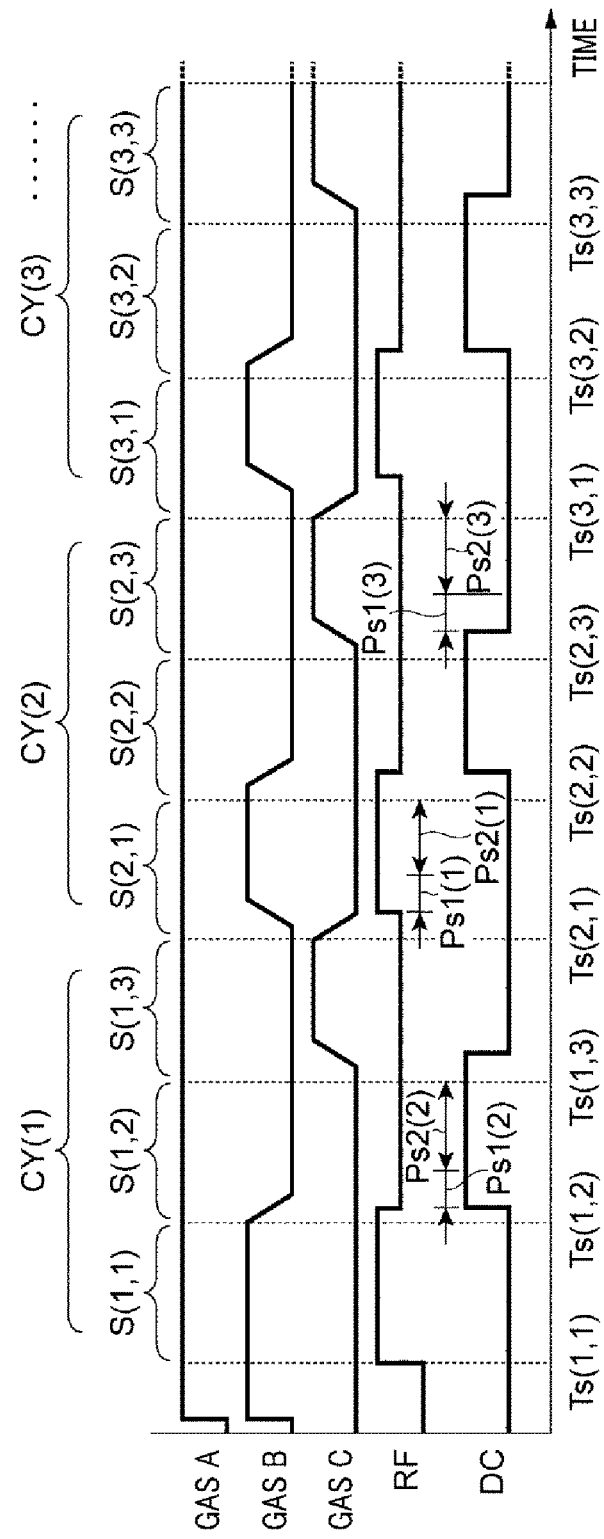
FIG. 2 is an example timing chart for a plasma processing method according to the exemplary embodiment.
Figure 3:
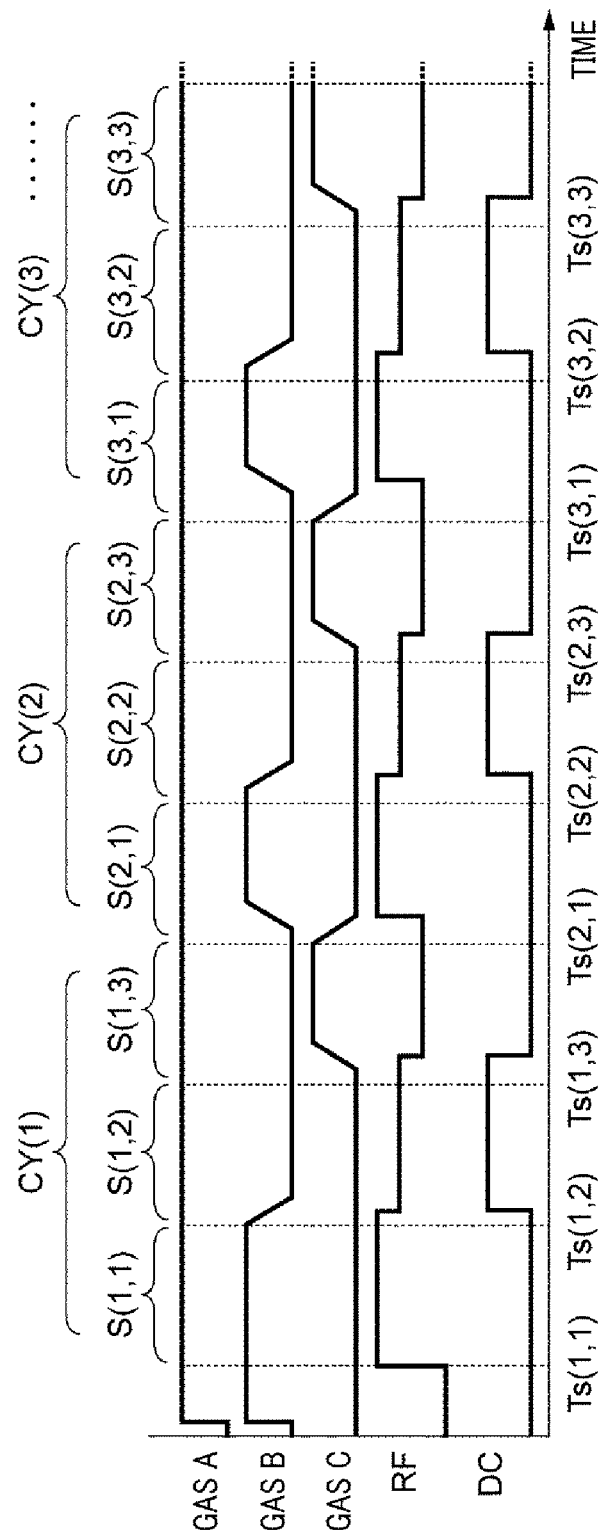
FIG. 3 is another example timing chart for the plasma processing method according to the exemplary embodiment.

Now, a plasma processing method according to an exemplary embodiment (hereinafter, referred to as "method MT") will be explained. The method MT can be performed by using the plasma processing apparatus 1. FIG. 2 and FIG. 3 are timing charts for the plasma processing method according to the exemplary embodiment. In each of FIG. 2 and FIG. 3, timing charts of a gas A, a gas B, a gas C, a high frequency power RF and a DC voltage are individually presented. In FIG. 2 and FIG. 3, a horizontal axis represents time. Further, a level of the timing chart of the gas A indicates the amount of the gas A supplied into the processing vessel 10; a level of the timing chart of the gas B represents the amount of the gas B supplied into the processing vessel 10; and a level of the timing chart of the gas C indicates the amount of the gas C supplied into the processing vessel 10. Furthermore, on the timing chart of the high frequency power RF, a level of the high frequency power indicates a power level of the high frequency power RF supplied to the susceptor 16. In addition, on the timing chart of the DC voltage DC, a high level of the DC voltage DC indicates that the DC voltage DC is applied to the upper electrode 46, whereas a low level of the DC voltage DC indicates that the DC voltage DC is not applied to the upper electrode 46 or indicates that the DC voltage DC having a lower level is applied.

As depicted in FIG. 2 and FIG. 3, in the method MT, multiple cycles CY are performed in sequence. Each of the multiple cycles CY includes plural stages S which are performed in sequence. Below, the multiple cycles or each of the multiple cycles will be denoted by "CY". Moreover, a notation of "CY(i)" is used to indicate each of the multiple cycles along with its operation order. The plural stages or each of the plural stages will be denoted by "S". Further, a notation of "S(i, j)" is used to present each of the plural stages S along with its operation order and an operation order of a cycle to which the corresponding stage S belongs. Furthermore, a notation of "S(j)" is used to indicate each of the plural stages along with its operation order. In addition, a notation of "Ts(i, j)" is used to indicate a start time point of each stage. Here, "i" is a variable which indicates an operation order of a cycle. Further, "i" represents an integer equal to or larger than 1 and equal to or smaller than IMAX, and "IMAX" is an integer equal to or larger than 2, which indicates the number of the multiple cycles. Further, "j" is an integer equal to or larger than 1 and equal to or smaller than JMAX, and "JMAX" is an integer equal to or larger than 2, which indicates the number of the plural stages in each cycle CY. Furthermore, in the example shown in FIG. 2 and FIG. 3, JMAX is 3, but not limited thereto.

In the plural stages S included in each of the multiple cycles CY of the method MT, plasma of different processing gases is generated. The processing gases respectively used in the plural stages S are designated in a recipe. Further, in each of the plural stages S, a setting of the high frequency power RF and a level of the DC voltage DC are stored in the recipe. The setting of the high frequency power RF includes a power level of the high frequency power RF and a mode of the high frequency power RF. The mode of the high frequency power RF is selected between a continuous wave and a pulse-modulated high frequency power. In addition, the length of a processing time of each of the plural stages S is stored in the recipe. The main controller 72 performs a control for the method MT according to the recipe.

In the method MT, prior to a start time point Ts(1, 1) of a stage S(1, 1), i.e., a first stage of a first cycle, a supply of a processing gas for the stage S(1, 1) from the gas supply system 55 is begun. Further, a supply of a high frequency power RF to the susceptor 16 is begun at the start time point Ts(1, 1) of the stage S(1, 1). Thereafter, the high frequency power RF is supplied to the susceptor 16 over the plural stages S of the multiple cycles CY.

In the method MT, when transitioning from a preceding stage to a succeeding stage (transitioning from a stage S(i, j−1) to a stage S(i, j) and transitioning from a stage S(i−1, JMAX) to a stage S(i, 1)), that is, at the start time point Ts(i, j) of each stage S, the processing gas supplied by the gas supply system 55 is changed under the control of the main controller 72. In the example shown in FIG. 2 and FIG. 3, in order to generate plasma of a first processing gas containing the gas A and the gas B at a first stage, i.e., at a stage S(i, 1), the processing gas supplied by the gas supply system 55 is changed to the first processing gas at a start time point Ts(i, 1). Further, in order to generate plasma of a second processing gas containing the gas A at a second stage, i.e., at a stage S(i, 2), the processing gas supplied by the gas supply system 55 is changed to the second processing gas at a start time point Ts(i, 2). Furthermore, in order to generate plasma of a third processing gas containing the gas A and the gas C at a third stage, i.e., at a stage S(i, 3), the processing gas supplied by the gas supply system 55 is changed to the third processing gas at a start time point Ts(i, 3). By way of example, but not limitation, the gas A may be a rare gas such as Ar; the gas B, a fluorocarbon gas; and the gas C, an oxygen gas.

In the method MT, at a time point when a parameter to be described later exceeds a threshold value Th(j) after the start time point Ts(i, j) of the stage S(i, j), that is, after the processing gas supplied by the gas supply system 55 is changed, at least one of the setting of the high frequency power RF and the level of the DC voltage DC for the stage S(i, j) is changed. In the example shown in FIG. 2, the power level of the high frequency power RF at the stage (i, 2) is changed to a power level lower than the power level of the high frequency power RF at the stage S(i, 1). Further, in the example shown in FIG. 2, the power level of the high frequency power RF at the stage S(i, 2) and a power level of the high frequency power RF at a stage S(i, 3) are same. Furthermore, in the example shown in FIG. 2, the level (absolute value) of the DC voltage DC at the stage S(i, 2) is changed to a higher level (absolute value) than the level (absolute value) of the DC voltage DC at the stage S(i, 1). In the example shown in FIG. 2, the level of the DC voltage DC at the stage S(i, 1) and a level of the DC voltage DC at the stage S(i, 3) are same. Moreover, at the stage S(i, 1) and the stage S(i, 3), the DC voltage DC may not be applied to the upper electrode 46.

Further, in the example shown in FIG. 3, the power level of the high frequency power RF at the stage S(i, 2) is changed to a power level lower than the power level of the high frequency power RF at the stage S(i, 1). In addition, in the example shown in FIG. 3, the power level of the high frequency power RF at the stage S(i, 3) is changed to a power level lower than the power level of the high frequency power RF at the stage S(i, 2). Further, in the example shown in FIG. 3, the level (absolute value) of the DC voltage DC at the stage S(i, 2) is changed to a higher level (absolute value) than the level (absolute value) of the DC voltage DC at the stage S(i, 1). In the example shown in FIG. 3, the level of the DC voltage DC at the stage S(i, 1) and the level of the DC voltage DC at the stage (i, 3) are same. In addition, at the stage S(i, 1) and the stage S(i, 3), the DC voltage DC may not be applied to the upper electrode 46. Further, in the example of FIG. 2 and FIG. 3, though the power level of the high frequency power RF is changed, at least one of the power level of the high frequency power and the mode of the high frequency power needs to be changed.

Figure 4:
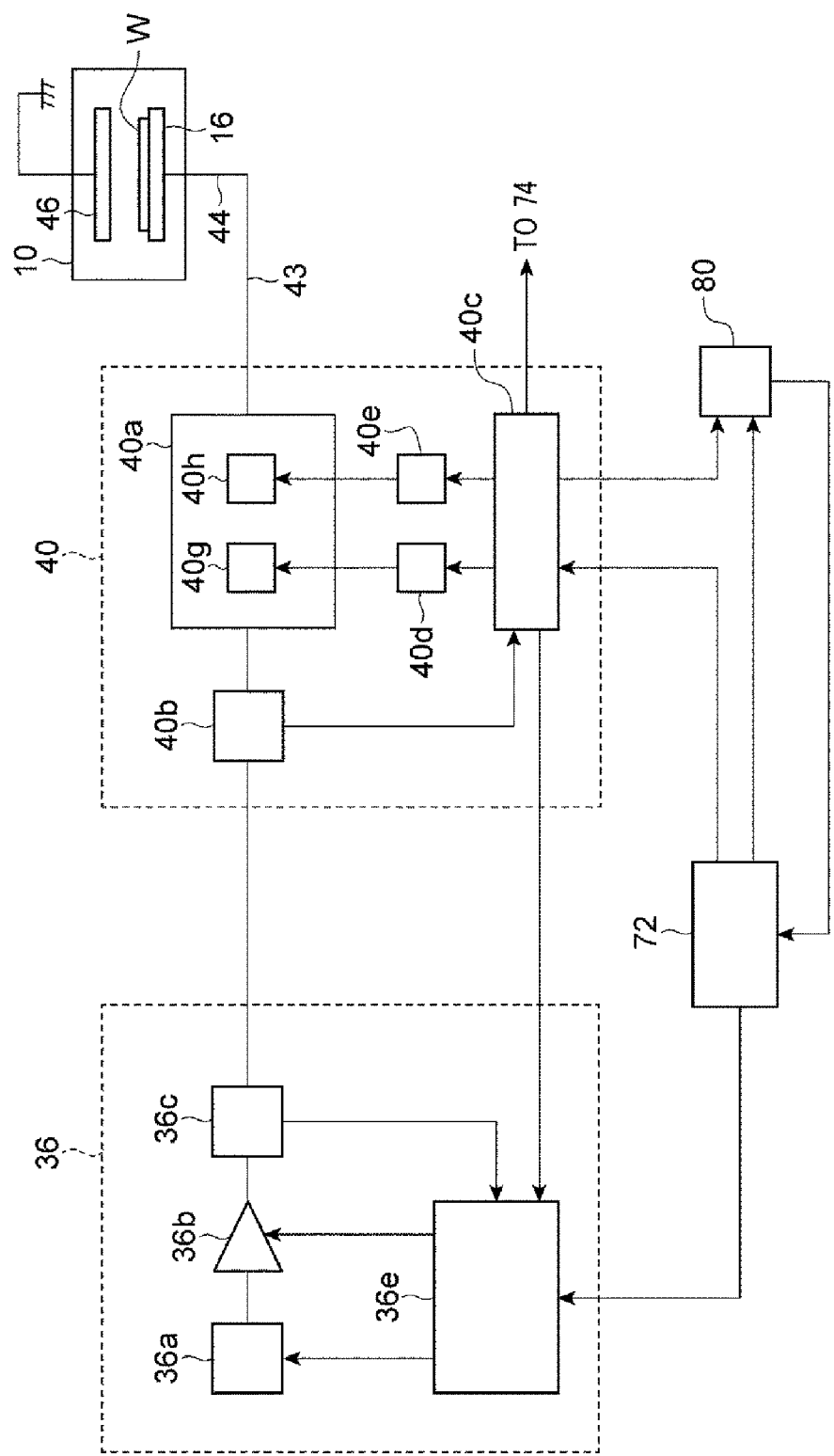
FIG. 4 is a diagram illustrating an example configuration of a high frequency power supply and a matching device.
Figure 5:
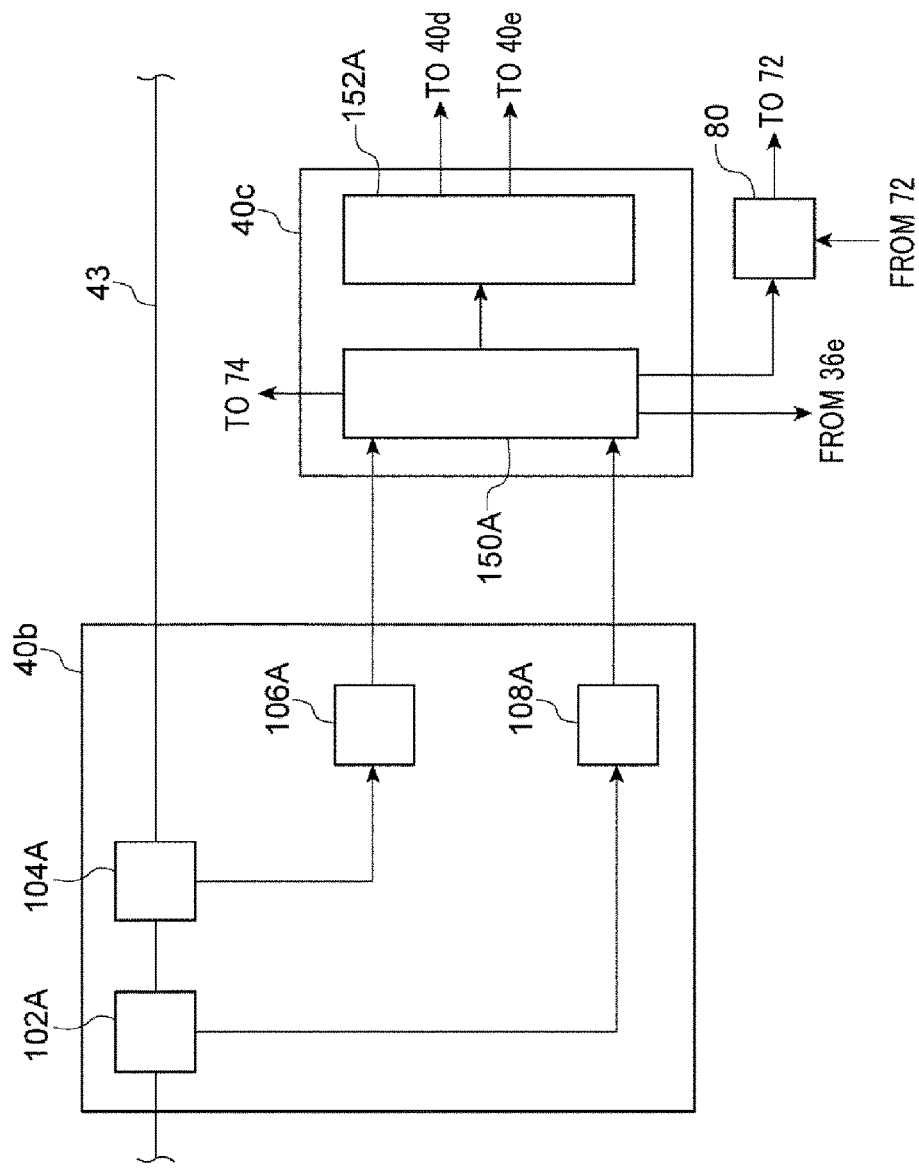
FIG. 5 is a diagram illustrating an example configuration of a sensor and a controller of the matching device.

The aforementioned parameter is calculated by an operation unit of the matching device 40 according to the exemplary embodiment. Hereinafter, referring to FIG. 4 and FIG. 5, the high frequency power supply 36 and the matching device 40 will be described in detail. FIG. 4 is a diagram illustrating an example configuration of the high frequency power 36 and the matching device 40, and FIG. 5 is a diagram illustrating an example configuration of a sensor and a controller of the matching device 40.

According to the exemplary embodiment, the high frequency power supply 36 includes an oscillator 36a, a power amplifier 36b, a power sensor 36c and a power supply controller 36e, as shown in FIG. 4. The power supply controller 36e is composed of a processor such as a CPU, and controls the oscillator 36a and the power amplifier 36b by applying control signals to the oscillator 36a and the power amplifier 36b individually through the use of a signal applied from the main controller 72 and a signal applied from the power sensor 36c.

The signal applied from the main controller 72 to the power supply controller 36e is a high frequency power setting signal generated according to the recipe. The high frequency power setting signal is a signal which designates the setting of the high frequency power RF. The high frequency power setting signal is output from the main controller 72 to the power supply controller 36e such that an output of the high frequency power RF having the setting designated by the corresponding high frequency power setting signal is begun by the high frequency power supply 36 at the start time point of the stage S(1, 1). Further, the high frequency power setting signal is output from the main controller 72 to the power supply controller 36e when changing the setting of the high frequency power RF at the stage S(i, j) performed after the stage S(1, 1). In response to a signal from an operation unit to be described later, the power supply controller 36e is operated to control the high frequency power supply 36 to output the high frequency power RF having the setting designated by the high frequency power setting signal.

The power supply controller 36e controls the oscillator 36a to output a high frequency power having a frequency designated by the high frequency power setting signal. An output of the oscillator 36a is connected to an input of the power amplifier 36b. The high frequency power output from the oscillator 36a is input to the power amplifier 36b. The power amplifier 36b amplifies the input high frequency power to output the high frequency power RF having a power designated by the high frequency power setting signal from an output thereof. Accordingly, the high frequency power RF is output from the high frequency power supply 36.

The power sensor 36c is provided at a rear end of the power amplifier 36b. The power sensor 36c is equipped with a directional coupler, a progressive wave power detector and a reflection wave power detector. The directional coupler sends a part of a progressive wave of the high frequency power RF to the progressive wave power detector, and sends a reflection wave to the reflection wave power detector. A signal specifying the frequency of the high frequency power RF is applied to this power sensor 36c from the power supply controller 36e. The progressive wave power detector generates a measurement value of a power of a component having the same frequency as the frequency of the high frequency power RF among all frequency components of the progressive wave, i.e., generates a progressive wave power measurement value PF1. This progressive wave power measurement value is sent to the power supply controller 36e for power feedback.

The reflection wave power detector generates a measurement value of a power of a component having the same frequency as the frequency of the high frequency power RF among all frequency components of the reflection wave, i.e., generates a reflection wave power measurement value PR11, and also generates a measurement value of a total power of the all frequency components of the reflection wave, i.e., generates a reflection wave power measurement value PR12. The reflection wave power measurement value PR11 is sent to the main controller 72 for monitor display. Further, the reflection wave power measurement value PR12 is sent to the power supply controller 36e for protection of the power amplifier 36b.

Further, a DC voltage setting signal is applied to the DC power supply 74 from the main controller 72. The DC voltage setting signal is a signal that designates a level of the DC voltage DC. The DC voltage setting signal is applied from the main controller 72 to the DC power supply 74 when changing the level of the DC voltage at the stage S(i, j). In response to a signal from the operation unit to be described later, the DC power supply 74 is operated to output a DC voltage DC having a level designated by the DC voltage setting signal. Alternatively, in case that the level of the DC voltage DC designated by the DC voltage setting signal is zero, the DC power supply 74 is operated to stop the output of the DC voltage DC in response to the signal from the operation unit to be described later.

As shown in FIG. 4, the matching device 40 is equipped with a matching circuit 40a, a sensor 40b, a controller 40c and actuators 40d and 40e. The matching circuit 40a includes variable reactance elements 40g and 40h. The variable reactance elements 40g and 40h may be implemented by, but not limited to, variable capacitors. Further, the matching circuit 40a may further include an inductor or the like.

The controller 40c is composed of, for example, a processor, and is operated under the control of the main controller 72. The controller 40c is configured to calculate a load impedance of the high frequency power supply 36 by using a measurement value sent from the sensor 40b. Further, the controller 40c is also configured to adjust a reactance of each of the variable reactance elements 40g and 40h by controlling the actuators 40d and 40e such that the calculated load impedance approximates to a matching point or an output impedance of the high frequency power supply 36. Each of the actuators 40d and 40e is implemented by, for example, a motor.

Furthermore, the controller 40c is configured to calculate a parameter to be described later by using the measurement value sent from the sensor 40b and configured to determine the time point for changing the setting of the high frequency power RF and/or the level of the DC voltage DC at each stage S.

As depicted in FIG. 5, the sensor 40b includes a current detector 102A, a voltage detector 104A, a filter 106A and a filter 108A. The voltage detector 104A is configured to detect a voltage waveform of the high frequency power RF transmitted on the power feed line 43 and is configured to output a voltage waveform analog signal indicating the corresponding voltage waveform. This voltage waveform analog signal is input to the filter 106A. The filter 106A is configured to generate a voltage waveform digital signal by digitizing the voltage waveform analog signal input thereto. Further, the filter 106A is configured to generate a filtered voltage waveform signal by extracting, from the voltage waveform digital signal, only a component having a set frequency of the high frequency power RF specified by the signal from the main controller 72. The filtered voltage waveform signal generated by the filter 106A is sent to an operation unit 150A of the controller 40c. Further, the filter 106A may be composed of, by way of non-limiting example, a FPGA (Field Programmable Gate Array).

The current detector 102A is configured to detect a current waveform of the high frequency power RF transmitted on the power feed line 43 and is configured to output a current waveform analog signal indicating the corresponding current waveform. This current waveform analog signal is input to the filter 108A. The filter 108A is configured to generate a current waveform digital signal by digitizing the current waveform analog signal input thereto. Further, the filter 108A is configured to generate a filtered current waveform signal by extracting, from the current waveform digital signal, only a component having the set frequency of the high frequency power RF specified by the signal from the main controller 72. The filtered current waveform signal generated by the filter 108A is sent to the operation unit 150A of the controller 40c. Further, the filter 108A may be composed of, by way of non-limiting example, a FPGA (Field Programmable Gate Array).

In order to achieve impedance matching in the matching device 40, the operation unit 150A of the controller 40c calculates a load impedance ZL1 of the high frequency power supply 36 by using the filtered voltage waveform signal sent from the filter 106A and the filtered current waveform signal sent from the filter 108A. To elaborate, the operation unit 150A calculates the load impedance ZL1 of the high frequency power supply 36 from an alternating voltage V1 specified by the filtered voltage waveform signal, an alternating current I1 specified by the filtered current waveform signal, and a phase difference $\Phi 1$ between the alternating voltage V1 and the alternating current I1. Further, the operation unit 150A is also configured to calculate a parameter to be described later from the alternating voltage V1, the alternating current I1 and the phase difference $\Phi 1$. The parameter may be the aforementioned load impedance ZL1. In this case, since the load impedance calculated for the impedance matching of the matching device 40 can be used as the parameter, it is not required to calculate the parameter additionally. Alternatively, the parameter may be any one of a load resistance Zr1, a load reactance Zi1 and a reflection wave coefficient $\Gamma 1$.

The load impedance ZL1 is calculated as V1/I1. The load resistance Zr1 is obtained by calculating a real part of the load impedance ZL1, and the load reactance Zi1 is obtained by calculating an imaginary part of the load impedance ZL1. Further, the reflection wave coefficient $\Gamma 1$ is calculating by the following Expression 1.

[Expression 1]

$$\Gamma = \frac{\sqrt{(Zr1-50)^2 + (Zi1)^2}}{(Zr1-50)^2 + (Zi1)^2} \quad (1)$$

Further, the reflection wave coefficient $\Gamma 1$ may also be calculated as PR11/PF1 by using the progressive wave power measurement value PF1 and the reflection wave power measurement value PR11 obtained by the power sensor 36c.

The operation unit 150A is configured to output the calculated load impedance ZL1 to a matching controller 152A. The matching controller 152A is configured to adjust the reactance of the variable reactance elements 40g and 40h by controlling the actuators 40d and 40e such that the load impedance ZL1 approximates to the output impedance of the high frequency power supply 36 (or the matching point). Accordingly, the impedance matching by the matching device 40 is performed. Further, the matching controller 152A may control the actuators 40d and 40e such that a moving average value of series of the load impedance ZL1 output by the operation unit 150A approximates to the output impedance of the high frequency power supply 36 (or the matching point).

Further, the operation unit 150A determines, at a stage S(i, j) except the stage S(1, 1), whether the obtained parameter exceeds a corresponding threshold value Th(j) from when the processing gas output by the gas supply system 55 is changed. Initially, the threshold value Th(j) is previously set as a dedicated value for the stage S(j) specified by the same value of "j" or set as a common value to the plural stages S. If the parameter exceeds the threshold value Th(j) at the state S(i, j), the operation unit 150A applies a signal to the high frequency power supply 36. In case that the high frequency power setting signal is output from the main controller 72 at the stage S(i, j), the high frequency power supply 36 changes the setting of the high frequency power RF to a setting designated by the high frequency power setting signal in response to the signal from the operation unit 150A. That is, in case that the high frequency power setting signal is output from the main controller 72 at the stage S(i, j), the high frequency power supply 36 changes the setting of the high frequency power RF to the setting designated by the high frequency power setting signal at a time point when the parameter exceeds the threshold value Th(j). Further, the changing of the setting of the high frequency power RF includes changing the power level of the high frequency power RF and/or changing the high frequency power RF from one of the continuous wave and the pulse-modulated high frequency power to the other thereof.

If the parameter exceeds the threshold value Th(j) at the stage S(i, j), the operation unit 150A applies a signal to the DC power supply 74. In case that the DC voltage setting signal is output from the main controller 72 at the stage S(i, j), the DC power supply 74 changes the level of the DC voltage DC to a level designated by the DC voltage setting signal in response to the signal from the operation unit 150A. That is, in case that the DC voltage setting signal is output from the main controller 72 at the stage S(i, j), the DC power supply 74 changes the level of the DC voltage DC to the level designated by the DC voltage setting signal at a time point when the parameter exceeds the threshold value Th(j).

Furthermore, the operation unit 150A sends, to a time adjusting unit 80, first information specifying the time point when the parameter exceeds the threshold value Th(j) at the stage S(i, j). This time adjusting unit 80 may be implemented by, but not limited to, a processor such as a CPU. The time adjusting unit 80 also receives, from the main controller 72, second information specifying a time point when transitioning to the stage S(i, j), i.e., the start time point Ts(i, j). The time adjusting unit 80 calculates a time difference between the time point specified by the first information and the time point specified by the second information. Then, the time adjusting unit 80 sends, to the main controller 72, time difference specifying information which specifies this time difference. The main controller 72 adjusts a length of a processing time for a stage S(j) of a subsequent cycle CY, e.g., a stage S(i+1, j) such that the processing time for the stage S(i+1, j) is increased from a preset processing time for the stage S(j) designated in the recipe by the time difference specified in the time difference specifying information.

Further, the operation unit 150A calculates a moving average value of a series of parameters, and adjusts the aforementioned threshold value Th(j) by using this moving average value. The series of parameters used to adjust the threshold value Th(j) include a parameter in a state that the impedance matching by the matching device 40 is completed in the stage S(j) specified by the same value of "j" in the completed cycle CY or in each of the currently performed stage S(i, j) and the stage S(j) specified by the same value of "j" in the completed cycle CY. Each of the parameters included in these series may be the same kind of parameter as the parameter which is compared with the threshold value Th(j).

Figure 6:
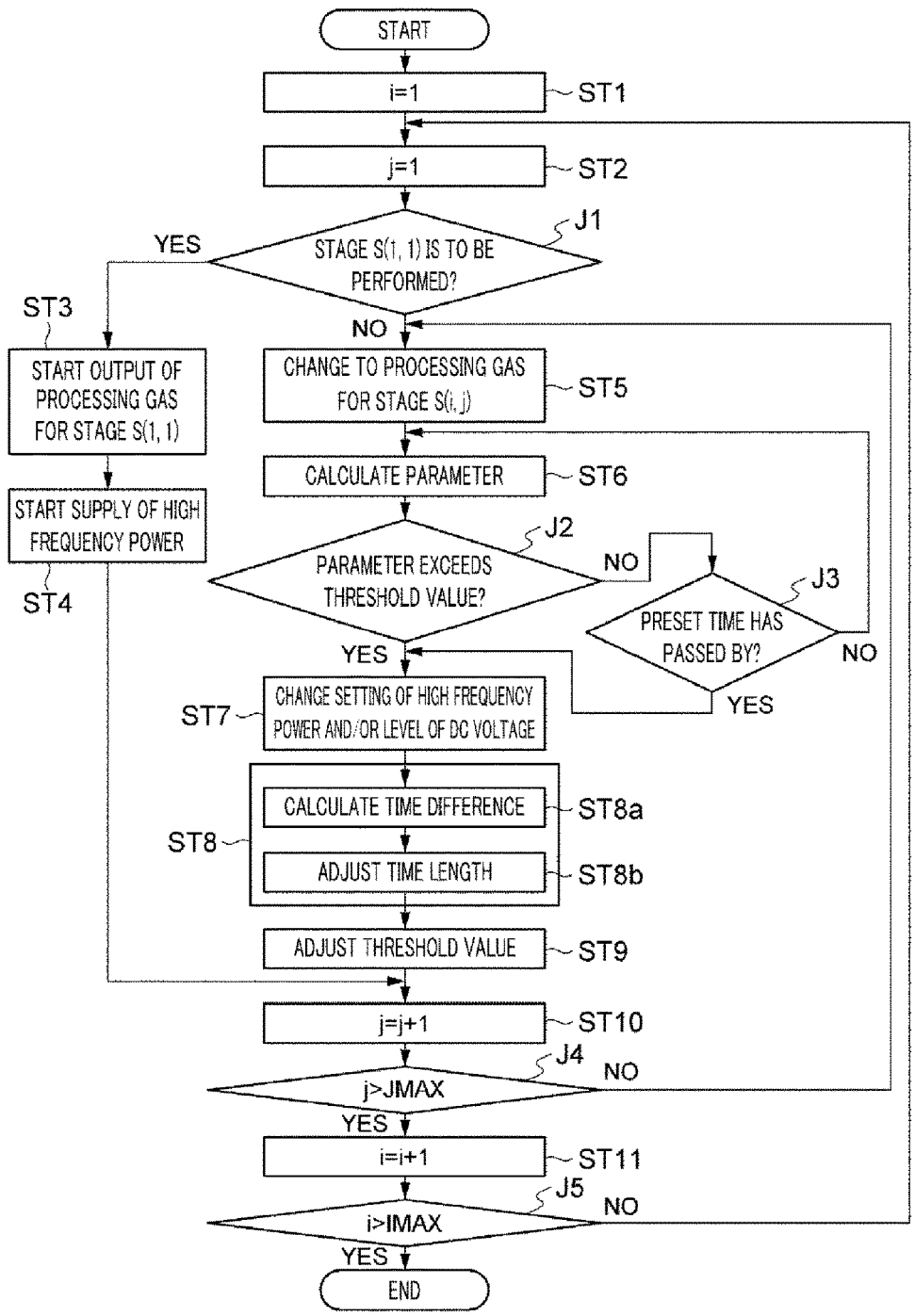
FIG. 6 is a flowchart for describing the plasma processing method according to the exemplary embodiment.

Now, referring to FIG. 6, the method MT will be elaborated in detail. FIG. 6 is a flowchart for describing the plasma processing method according to the exemplary embodiment. In the method MT, a process ST1 is first performed. In the process ST1, "i" is set to be 1 by the main controller 72. Here, "i" is the variable which specifies the operation order of each of the multiple cycles, as stated above. In a subsequent process ST2, "j" is set to be 1 by the main controller 72. Here, "j" is the variable which specifies the operation order of each of the plural stages S in each cycle CY, as mentioned above.

In a subsequent process J1, it is determined whether the first stage of the first cycle is to be performed. That is, it is determined by the main controller 72 whether to perform the stage S(1, 1). In case of performing the stage S(1, 1), in a subsequent process ST3, the main controller 72 controls the gas supply system 55 to start the output of the processing gas for the stage S(1, 1) designated in the recipe. Then, in a next process ST4, the high frequency power supply 36 starts supplying the high frequency power RF having the setting designated by the high frequency power setting signal from the main controller 72. Thereafter, the processing proceeds to a process ST10.

Meanwhile, if it is determined in the process J1 that a stage S(i, j) other than the stage S(1, 1) is to be performed, the gas supply system 55 is controlled by the main controller 72 in a process ST5 such that the processing gas output from the gas supply system 55 is changed to the processing gas for the stage S(i, j) designated in the recipe. Further, the changeover of the processing gas of the gas supply system 55 in the process ST5 is performed when transitioning to the stage S(i, j), that is, at the start time point Ts(i, j) of the stage S(i, j).

In a following process ST6, the aforementioned parameter is calculated by the operation unit 150A. The calculation of the parameter by the operation unit 150A is begun from the time point when the processing gas output from the gas supply system 55 is changed in the process ST5. In a subsequent process J2, it is determined by the operation unit 150A whether the obtained parameter exceeds the threshold value Th(j). If it is determined in the process J2 that the parameter exceeds the threshold value Th(j), the processing proceeds to a process ST7. Meanwhile, if it is determined that the parameter does not exceed the threshold value, it is determined by the operation unit 150A in a process J3 whether a preset time has elapsed from the start time point of the stage S(i, j). If it is determined in the process J3 that the preset time has not passed by from the start time point of the stage S(i, j), the process ST6 is performed again.

Meanwhile, if it is determined in the process J3 that the preset time has elapsed from the start time point of the stage S(i, j), the processing advances to the process ST7. Through the process J3, it can be avoided that the processing does not proceed to the process ST7.

In the process ST7, to notify that the parameter exceeds the threshold value Th(j), the aforementioned signals are applied to the high frequency power supply 36 and the DC power supply 74 by the operation unit 150A. In case that the high frequency power setting signal is applied to the high frequency power supply 36 from the main controller 72 for the stage S(i, j), the high frequency power supply 36 changes the setting of the high frequency power RF to the setting designated by the high frequency power setting signal. Further, in case that the DC voltage setting signal is applied to the DC power supply 74 form the main controller 72 for the stage S(i, j), the DC power supply 74 changes the level of the DC voltage to the level designated by the DC voltage setting signal.

Subsequently, in the method MT, a process ST8 is performed. The process ST8 includes a process ST8a and a process ST8b. In the process ST8a, the aforementioned time difference is calculated. To elaborate, the first information specifying the time point when the parameter exceeds the threshold value Th(j) in the stage S(i, j) is applied to the time adjusting unit 80 from the operation unit 150A, and the second information specifying the time point when transitioning to the stage S(i, j), i.e., the start time point Ts(i, j) is also applied to the time adjusting unit 80 from the main controller 72. In the process ST8a, the time adjusting unit 80 calculates the time difference between the time point specified by the first information and the time point specified by the second information. Then, the time adjusting unit 80 applies the time difference specifying information which specifies the corresponding time difference to the main controller 72. In the subsequent process ST8b, the main controller 72 adjusts the length of the processing time of the stage S(j) of the subsequent cycle CY, e.g., the process S(i+1, j) such that the processing time of the stage S(i+1, j) is increased from the preset processing time of the stage S(j) designated in the recipe by the time difference specified in the time difference specifying information.

In the method MT, a process ST9 is performed subsequently. In the process ST9, the threshold value Th(j) is adjusted. To be specific, the operation unit 150A calculates a moving average value of a series of parameters, and adjusts the threshold value Th(j) by using this moving average value. The series of parameters used to adjust the threshold value Th(j) include the parameter in the state that the impedance matching by the matching device 40 is completed in the stage S(j) specified by the same value of "j" in the completed cycle CY or in each of the currently performed stage S(i, j) and the stage S(j) specified by the same value of "j" in the completed cycle CY. Further, the matching device 40 is capable of performing the matching operation at any time required while the method MT is being performed.

In the method MT, a subsequent process ST10 is conducted. In the process ST10, j is increased by an increment of 1 by the main controller 72. In a following process J4, it is determined whether j is larger than JMAX. If J is equal to or smaller than JMAX, the processing proceeds to the process ST5. Meanwhile, if j is larger than JMAX, i is increased by an increment of 1 by the main controller 72 in a subsequent process ST11. Then, in a process J5, it is determined whether i is larger than IMAX. If i is equal to or smaller than IMAX, the processing proceeds to the process ST2. Meanwhile, if i is larger than IMAX, the method MT is ended.

If the processing gas within the processing vessel 10 is changed while the supply of the high frequency power RF is continued, the impedance of plasma generated within the processing vessel 10 is changed. Since the aforementioned parameter obtained by the operation unit 150A varies depending on the impedance of the plasma, the parameter well reflects the variation in the processing gas which exists within the processing vessel 10. In the method MT, by detecting the time point when this parameter exceeds the threshold value Th(j), the time point when the processing gas within the processing vessel 10 is changed can be detected accurately. Furthermore, since at least one of the setting of the high frequency power RF and the level of the DC voltage DC is changed at this time point, it is possible to change the setting of the high frequency power RF and/or the level of the DC voltage DC at an appropriate time point when the processing gas within the processing vessel 10 is changed.

Further, the length of the processing time of each of the plural stages S is initially set in the recipe. Accordingly, if the time point when the parameter exceeds the threshold value Th(j) at the stage S(i, j) is delayed, the time length of the plasma processing from this time point in the stage S(i, j) is shortened. According to this exemplary embodiment, since the time length of the stage S(j) in the subsequent cycle CY is increased by the time difference calculated in the process ST8a, the length of the total processing time of the plasma processing at the same stages in the multiple cycles CY can be maintained substantially same.

Further, in the state that the impedance matching by the matching device 40 is completed in the stage S(i, j), the processing gas used in the stage S(i, j) reaches the inside of the processing vessel 10 sufficiently. Accordingly, by adjusting the threshold value Th(j) with the moving average value of the series of the parameters in this state, the timing when the processing gas within the processing vessel 10 is changed can be detected more accurately.

Figure 7:
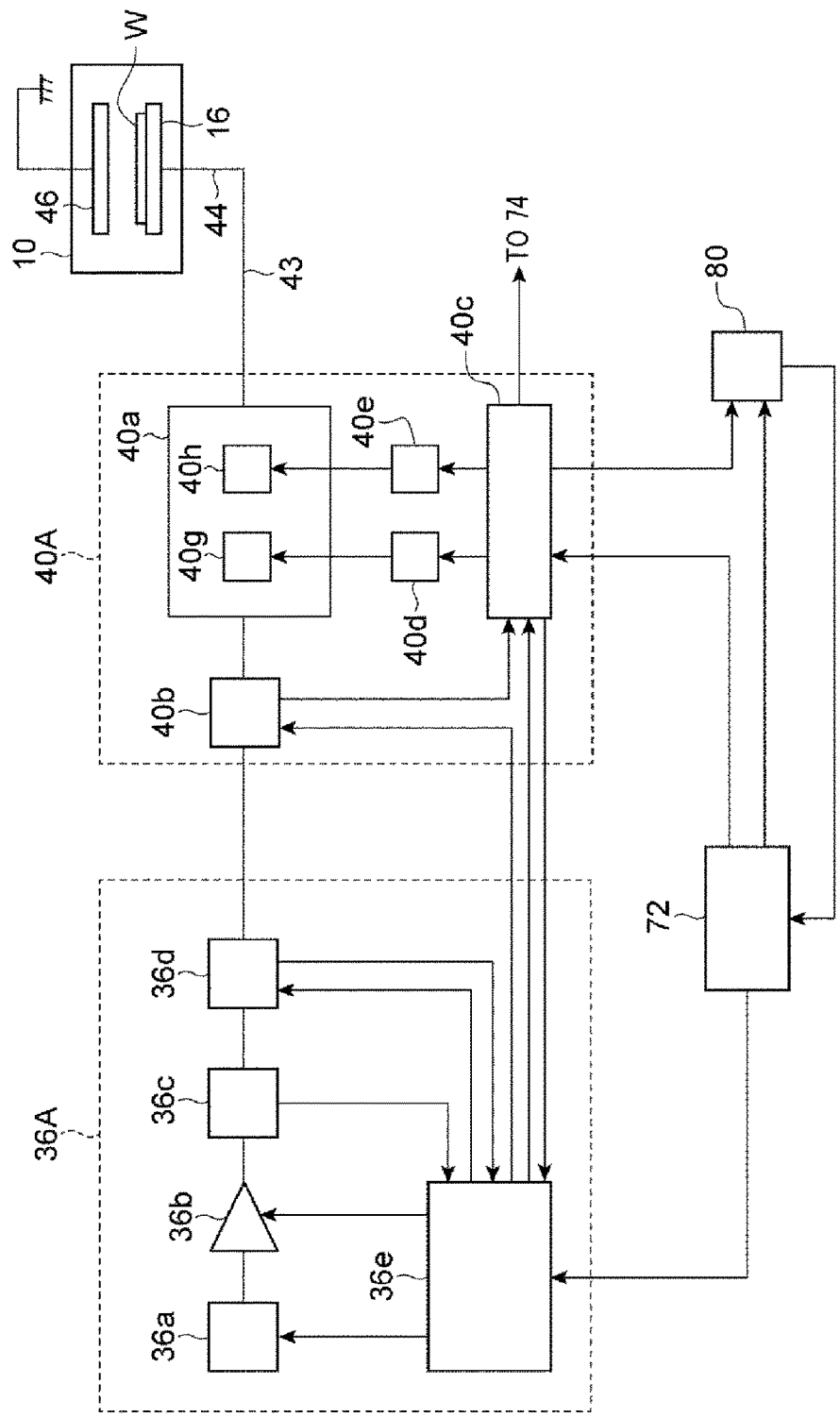
FIG. 7 is a diagram illustrating another example configuration of a high frequency power supply and a matching device.
Figure 8:
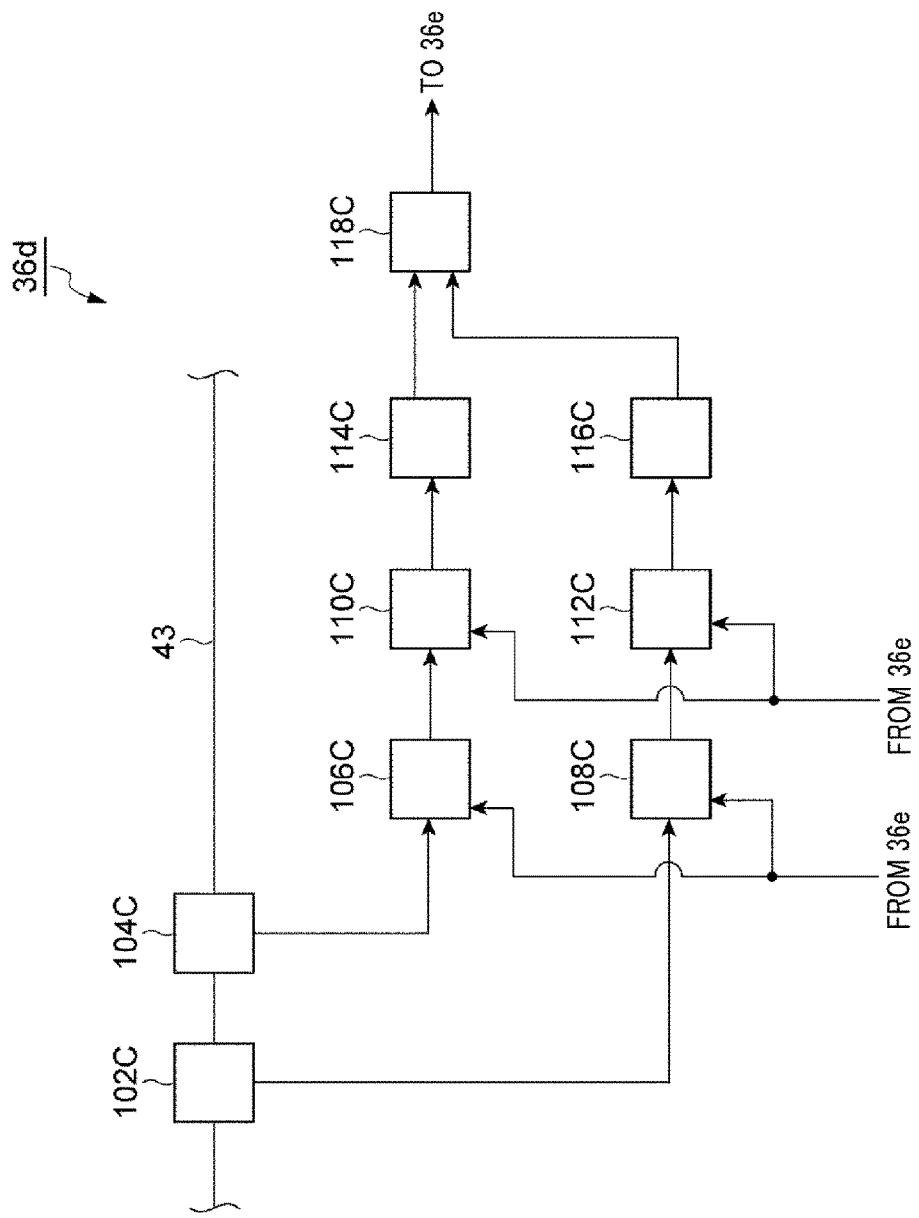
FIG. 8 is a diagram illustrating a configuration of an impedance sensor of the high frequency power supply.

Now, another exemplary embodiment will be explained. In a method MT according to another exemplary embodiment, a frequency of the high frequency power RF is adjusted in each of the plural stages S. Further, according to still another exemplary embodiment, a power of the high frequency power RF as well as the frequency thereof is adjusted in each of the plural stages S. In the following, in order to perform the method MT of the present exemplary embodiment, a high frequency power supply 36A and a matching device 40A employed in the plasma processing apparatus 1 instead of the high frequency power 36 and the matching device 40 will be explained with reference to FIG. 7 and FIG. 8. FIG. 7 is a diagram illustrating a configuration of the high frequency power supply 36A and the matching device 40A. FIG. 8 is a diagram illustrating a configuration of an impedance sensor of the high frequency power supply 36A.

As depicted in FIG. 7, the high frequency power supply 36A includes, like the high frequency power supply 36, an oscillator 36a, a power amplifier 36b, a power sensor 36c and a power supply controller 36e. The high frequency power supply 36A further includes an impedance sensor 36d. Below, regarding the individual components of the high frequency power supply 36A, distinctive features from the corresponding components of the high frequency power supply 36 will be described. Further, the impedance sensor 36d will also be explained.

The power supply controller 36e of the high frequency power supply 36A is configured to output, to the oscillator 36a, a frequency control signal for setting a frequency of the high frequency power RF in each of a first sub-period Ps1(j) and a second sub-period Ps2(j) within the processing time of the stage S(i, j). To elaborate, the power supply controller 36e receives, from the impedance sensor 36d, a moving average value Imp11 of the load impedance of the high frequency power supply 36A in the first sub-period Ps1(j) within the processing time of the past stage S(j) specified by the same value of "j" as in the stage S(i, j) and a moving average value Imp12 of the load impedance of the high frequency power supply 36A in the second sub-period Ps2(j) within the processing time of the corresponding past stage S(j).

If the moving average value Imp11 and the moving average value Imp12 fall within a preset control range, the power supply controller 36e sends, to the oscillator 36a, the frequency control signal for setting the frequency of the high frequency power RF for each of the first sub-period Ps1(j) and the second sub-period Ps2(j) within the processing time of the stage S(i, j) in order to allow the load impedance of the high frequency power supply 36A in the first sub-period Ps1(j) estimated from the moving average value Imp11 and the load impedance of the high frequency power supply 36A in the second sub-period Ps2(j) estimated from the moving average value Imp12 to approximate to a matching point. The oscillator 36a sets the frequency of the high frequency power RF in the first sub-period Ps1(j) and the frequency of the high frequency power RF in the second sub-period Ps2(j) within the processing time of the stage S(i, j).

Meanwhile, in case that the moving average value Imp11 or the moving average value Imp12 does not fall within the preset control rage, the power supply controller 36e sends, to the matching device 40A, a control signal for allowing the matching device 40A to perform impedance matching of the high frequency power supply 36A. Here, allowing the load impedance to approximate to the matching point ideally implies making the load impedance coincident with the matching point. Further, the "preset control range" refers to a range in which the load impedance of the high frequency power supply 36A can be matched with the matching point or an output impedance of the high frequency power supply 36A through the control of the frequency of the high frequency power RF.

The power amplifier 36b generates the high frequency power RF by amplifying the high frequency power output from the oscillator 36a, and then, outputs the corresponding high frequency power RF. This power amplifier 36b is controlled by the power supply controller 36e. To be specific, the power supply controller 36e controls the power amplifier 36b to output the high frequency power RF having a power level designated by the main controller 72.

In the present exemplary embodiment, the power supply controller 36e may control the power amplifier 36b such that the power level of the high frequency power RF in the first sub-period Ps1(j) is higher than that of the high frequency power RF in the second sub-period Ps2(j). By way of example, the power level of the high frequency power RF in the first sub-period Ps1(j) of the stage S(i, j) may be set, based on the reflection wave power measurement value PR11 in the first sub-period Ps1(j) of the stage S(i, j) or the moving average value of the reflection wave power measurement value PR11 in the first sub-period Ps1(j) within the processing time of the past stage S(j) specified by the same value of "j" as in the stage S(i, j), such that the power level of the high frequency power RF combined to the plasma reaches a preset power level. Further, the power level of the high frequency power RF in the second sub-period Ps2(j) of the stage S(i, j) may be set, based on the reflection wave power measurement value PR11 in the second sub-period Ps2(j) of the stage S(i, j) or the moving average value of the reflection wave power measurement value PR11 in the second sub-period Ps2(j) within the processing time of the past stage S(j) specified by the same value of "j" as in the stage S(i, j), such that the power level of the high frequency power RF combined to the plasma reaches a preset power level.

The impedance sensor 36d calculates the moving average value Imp11 of the load impedance of the high frequency power supply 36A in the first sub-periods Ps1(j) within the processing times of the stages S(j) specified by the same value of "j" as in the stage S(i, j) among the plural stages of the completed cycles CY. Further, the impedance sensor 36d also calculates the moving average value Imp12 of the load impedance of the high frequency power supply 36A in the second sub-periods Ps2(j) within the processing times of the stages S(j) specified by the same value of "j" as in the stage S(i, j) among the plural stages of the completed cycles CY. As depicted in FIG. 2, within the processing time of each stage S(j), the first sub-period Ps1(j) is a period ranging from the time point when the setting of the high frequency power RF or the level of the DC voltage DC is changed to a certain time point within the processing time. Further, within the processing time of each stage S(j), the second sub-period Ps2(j) is a period ranging from the certain time point to the end time point of the corresponding processing time.

A time length of the first sub-period Ps1(j) and a time length of the second sub-period Ps2(j) are set by the power supply controller 36e. By way of example, the time length of the first sub-period Ps1(j) may be a preset time length stored in the power supply controller 36e, and the time length of the second sub-period Ps2(j) may be another predetermined time length stored in the power supply controller 36e. Alternatively, based on time series of the aforementioned reflection wave power measurement value PR11, the power supply controller 36e may set, as the second sub-period Ps2(j), a period in which the reflection wave power measurement value PR11 is stabilized equal to or below a preset value within the processing time of the stage S(i, j). In such a case, a period prior to this second sub-period Ps2(j) within the processing time of the stage S(i, j) may be set as the first sub-period Ps1(j).

Figure 9:
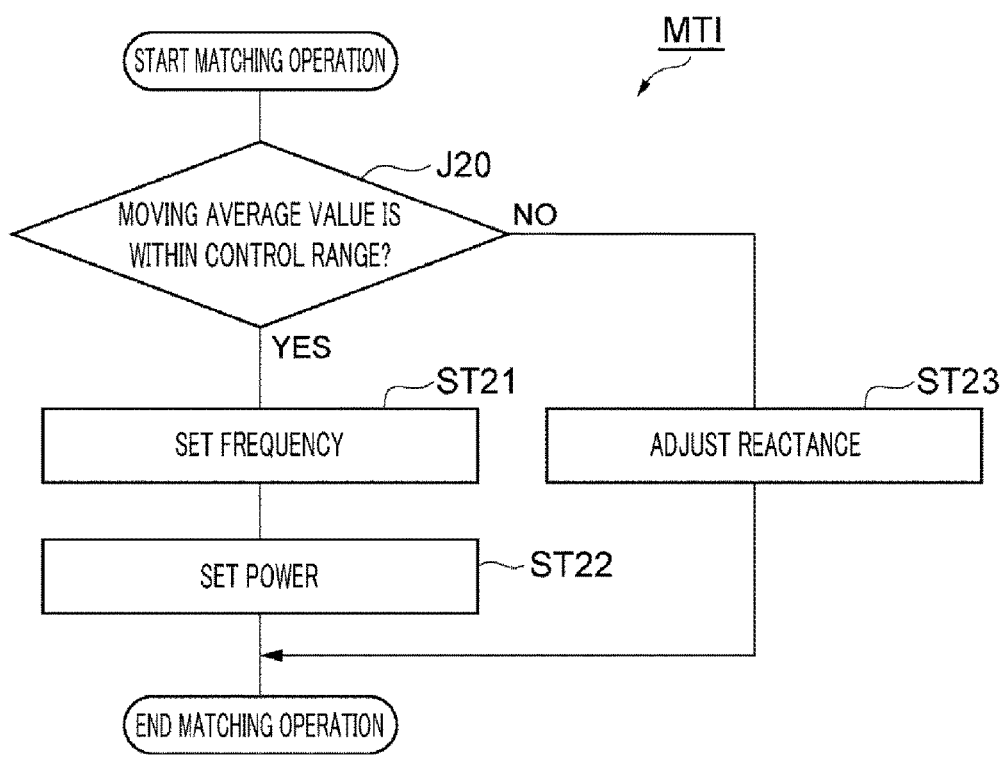
FIG. 9 is a flowchart for describing an impedance matching method performed in a plasma processing method according to another exemplary embodiment.

As illustrated in FIG. 9, the impedance sensor 36d includes a current detector 102C, a voltage detector 104C, a filter 106C, a filter 108C, an average value calculator 110C, an average value calculator 112C, a moving average value calculator 114C, a moving average value calculator 116C and an impedance calculator 118C.

The voltage detector 104C is configured to detect a voltage waveform of the high frequency power RF transmitted on the power feed line 43 and is configured to output a voltage waveform analog signal indicating the corresponding voltage waveform. This voltage waveform analog signal is input to the filter 106C. The filter 106C is configured to generate a voltage waveform digital signal by digitizing the voltage waveform analog signal input thereto. Further, the filter 106C receives, from the power supply controller 36e, the signal specifying the frequency of the high frequency power RF for each of the first sub-period Ps1(j) and the second sub-period Ps2(j), and then, generates a filtered voltage waveform signal by extracting, from the voltage waveform digital signal, only a component corresponding to the frequency specified by this signal. Further, the filter 106C may be composed of, by way of non-limiting example, a FPGA (Field Programmable Gate Array).

The filtered voltage waveform signal generated by the filter 106C is output to the average value calculator 110C. The average value calculator 110C receives, from the power supply controller 36e, a sub-period specifying signal specifying the first sub-period Ps1(j) and the second sub-period Ps2(j). The average value calculator 110C calculates, from the filtered voltage waveform signal, an average value VA11 of the voltage in the first sub-period Ps1(j) within the processing time of the stage S(i, j) specified by using the sub-period specifying signal. Further, the average value calculator 110C also calculates, from the filtered voltage waveform signal, an average value VA12 of the voltage in the second sub-period Ps2(j) within the processing time of the stage S(i, j) specified by using the sub-period specifying signal. Furthermore, the average value calculator 110C may be composed of, by way of non-limiting example, a FPGA (Field Programmable Gate Array).

The average value VA11 and the average value VA12 obtained by the average value calculator 110C are output to the moving average value calculator 114C. The moving average value calculator 114C calculates a moving average value (moving average value VMA11) of a preset number of average values VA11 which are obtained in the first sub-periods Ps1(j) of the present number of recently performed stages S(j) among a multiple number of average values VA11 previously obtained for the stages S(j) specified by the same value of "j" as in the stage S(i, j) among the plural stages belonging to the completed cycles CY. Further, the moving average value calculator 114C also calculates a moving average value (moving average value VMA12) of the preset number of average values VA12 which are obtained for the second sub-periods Ps2(j) of the present number of recently performed stages S(j) among the multiple number of average values VA12 previously obtained for the stages S(j) specified by the same value of "j" as in the stage S(i, j). The moving average values VMA11 and VMA12 obtained by the moving average value calculator 114C are output to the impedance sensor 118C. Further, the moving average value calculator 114C may be implemented by, by way of non-limiting example, a CPU or a FPGA (Field Programmable Gate Array).

The current detector 102C is configured to detect a current waveform of the high frequency power RF transmitted on the power feed line 43 and is configured to output a current waveform analog signal indicating the corresponding current waveform. This current waveform analog signal is input to the filter 108C. Further, the filter 108C is configured to generate a current waveform digital signal by digitizing the current waveform analog signal input thereto. Further, the filter 108C receives, from the power supply controller 36e, the signal specifying the frequency of the high frequency power RF for each of the first sub-period Ps1(j) and the second sub-period Ps2(j), and then, generates a filtered current waveform signal by extracting, from the current waveform digital signal, only a component corresponding to the frequency specified by this signal. Further, the filter 108C may be composed of, by way of non-limiting example, a FPGA (Field Programmable Gate Array).

The filtered current waveform signal generated by the filter 108C is output to the average value calculator 112C. The average value calculator 112C receives the aforementioned sub-period specifying signal from the power supply controller 36e. The average value calculator 112C calculates, from the filtered current waveform signal, an average value IA11 of the electric currents in the first sub-period Ps1(j) within the processing time of the stage S(i, j) specified by using the sub-period specifying signal. Further, the average value calculator 112C also calculates, from the filtered current waveform signal, an average value IA12 of the electric currents in the second sub-period Ps2(j) within the processing time of the stage S(i, j) specified by using the sub-period specifying signal. Furthermore, the average value calculator 112C may be composed of, by way of non-limiting example, a FPGA (Field Programmable Gate Array).

The average value IA11 and the average value IA12 obtained by the average value calculator 112C are output to the moving average value calculator 116C. The moving average value calculator 116C calculates a moving average value (moving average value IMA11) of the preset number of average values IA11 which are obtained in the first sub-periods Ps1(j) of the present number of recently performed stages S(j) among the multiple number of average values IA11 previously obtained for the stages S(j) specified by the same value of "j" as in the stage S(i, j) among the plural stages belonging to the completed cycles. Further, the moving average value calculator 116C also calculates a moving average value (moving average value IMA12) of the preset number of average values IA12 which are obtained in the second sub-periods Ps2(j) of the present number of recently performed stages S(j) among the multiple number of average values IA12 previously obtained for the stages S(j) specified by the same value of "j" as in the stage S(i, j) among the plural stages belonging to the completed cycles. The moving average values IMA11 and IMA12 obtained by the moving average value calculator 116C are output to the impedance sensor 118C. Further, the moving average value calculator 116C may be composed of, by way of non-limiting example, a CPU or a FPGA (Field Programmable Gate Array).

The impedance calculator 118C calculates the moving average value Imp11 of the load impedance of the high frequency power supply 36A from the moving average value IMA11 and the moving average value VMA11. This moving average value Imp11 includes an absolute value and a phase component. Further, the impedance calculator 118C also calculates the moving average value Imp12 of the load impedance of the high frequency power supply 36A from the moving average value IMA12 and the moving average value VMA12. This moving average value Imp12 includes an absolute value and a phase component. The moving average values Imp11 and Imp12 obtained by the impedance calculator 118C are output to the power supply controller 36e. The moving average values Imp11 and Imp12 are used to set the frequency of the high frequency power RF in the power supply controller 36e, as stated above.

Referring back to FIG. 7, the matching device 40A includes, like the matching device 40, a matching circuit 40a, a sensor 40b, a controller 40c and actuators 40d and 40e. Below, regarding the individual components of the matching device 40A, distinctive features from the corresponding components of the matching device 40 will be discussed.

Like the impedance sensor 36d, the sensor 40b of the matching device 40A receives, from the power supply controller 36e, the signal specifying the frequency of the high frequency power RF for each of the first sub-period Ps1(j) and the second sub-period Ps2(j), and then, generates a filtered voltage waveform signal by extracting, from the voltage waveform digital signal, only the component corresponding to the frequency specified by this signal. Further, the sensor 40b outputs the filtered voltage waveform signal to the controller 40c. Furthermore, like the impedance sensor 36d, the sensor 40b of the matching device 40A receives, from the power supply controller 36e, the signal specifying the frequency of the high frequency power RF for each of the first sub-period Ps1(j) and the second sub-period Ps2(j), and then, generates a filtered current waveform signal by extracting, from the current waveform digital signal, only the component corresponding to the frequency specified by this signal. The sensor 40b outputs this filtered current waveform signal to the controller 40c.

If the moving average value Imp11 or the moving average value Imp12 does not fall within the preset control range, in response to the aforementioned control signal which is sent from the power supply controller 36e, the controller 40c of the matching device 40A controls the actuators 40d and 40e such that the load impedance of the high frequency power supply 36A specified by an average value of the moving average value Imp11 and the moving average value Imp12 approximates to the matching point. Alternatively, if the moving average value Imp11 or the moving average value Imp12 does not fall within the preset control range, in response to the aforementioned control signal which is sent from the power supply controller 36e, the controller 40c of the matching device 40A controls the actuators 40d and 40e such that the load impedance of the high frequency power supply 36A specified by the moving average value Imp12 approximates to the matching point.

Now, a method of an impedance matching performed in the plasma processing apparatus 1 equipped with the high frequency power supply 36A and the matching device 40A described with reference to FIG. 7 and FIG. 8 will be explained. FIG. 9 is a flowchart for describing a method of an impedance matching performed in a plasma processing method according to another exemplary embodiment. The method MTI depicted in FIG. 9 is performed in each of the plural stages S. Hereinafter, the method MTI will be explained for the process S(j).

When initially performing the method MT, each of the plural stages S is not performed a sufficient number of times to calculate the aforementioned moving average values Imp11 and Imp12. Thus, when initially performing the method MT, only the calculation of the aforementioned average values VA11, IA11, VA12 and IA12 and the accumulation thereof are performed.

After each of the plural stages S is performed a sufficient number of times to calculate the moving average values Imp11 and Imp12, the moving average value Imp11 and the moving average value Imp12 are calculated in the impedance sensor 36d.

After the moving average values Imp11 and Imp12 are obtained, a process J20 is performed at the stage S(i, j), as shown in FIG. 9. In the process J20, it is determined by the power supply controller 36e whether the moving average value Imp11 and the moving average value Imp12 are within the aforementioned preset control range.

If it is determined that the moving average value Imp11 and the moving average value Imp12 are within the aforementioned preset control range, the power supply controller 36e sets, in a process ST21, the frequency of the high frequency power RF in the first sub-period Ps1(j) within the processing time of the stage S(i, j) and sets the frequency of the high frequency power RF in the second sub-period Ps2(j) within the processing time of the stage S(i, j), as stated above. Then, in a subsequent process ST22, the power supply controller 36e sets the power level of the first high frequency power RF in the first sub-period Ps1(j) within the processing time of the stage S(i, j), and sets the power level of the high frequency power RF in the second sub-period Ps2(j) within the processing time of the stage S(i, j), as stated above.

If, on the other hand, it is determined that the moving average value Imp11 or the moving average value Imp12 does not fall within the aforementioned preset control range, a control signal is sent from the power supply controller 36e to the matching device 40A in a process ST23 to allow the matching device 40A to perform the impedance matching of the high frequency power supply 36A. In response to this control signal, the controller 40c of the matching device 40A controls the actuators 40d and 40e such that the load impedance of the high frequency power supply 36A approximates to the matching point, as stated above.

Since the first sub-period Ps1(j) in the stage S(i, j) is a period including the time point when the setting of the high frequency power RF and/or the setting of the DC voltage DC is changed, a reflection wave on the power feed line 43 may be larger than a reflection wave in the second sub-period Ps2(j). Thus, in order to reduce the reflection wave of the high frequency power RF, it is required to match the load impedance of the high frequency power supply 36A in each of the first sub-period Ps1(j) and the second sub-period Ps2(j) individually with the output impedance of the high frequency power supply 36A. According to the impedance matching method MTI shown in FIG. 9, the frequency of the high frequency power RF in the first sub-period Ps1(j) is adjusted such that the load impedance of the high frequency power supply 36A estimated from the moving average value Imp11 approximates to the output impedance of the high frequency power supply 36A. Further, the frequency of the high frequency power RF in the second sub-period Ps2(j) is adjusted based on the moving average value Imp12 in the same way as in the process of adjusting the frequency of the high frequency power RF in the first sub-period Ps1(j). According to the method MTI, since the high frequency power supply 36A can change the frequency of the high frequency power RF at a high speed, it is possible to perform the impedance matching while keeping up with the variation of the load impedance at a high speed. Furthermore, through the process ST22, in case that the power of the high frequency power RF combined to the plasma is insufficient in the first sub-period Ps1(j), the power of the high frequency power RF can be supplemented.

In the above, the various exemplary embodiments have been described. However, the exemplary embodiments are not limiting, and various changes and modifications may be made. By way of example, the high frequency power supply 36 and the high frequency power supply 36A may be configured to supply the high frequency power RF to the upper electrode 46. Further, the plasma processing apparatus configured to perform the method MT is not limited to the capacitively coupled plasma processing apparatus. The method MT may also be applicable to any of various plasma processing apparatuses equipped with the first electrode and the second electrode, e.g., an inductively coupled plasma processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A plasma processing apparatus for performing a plasma processing method, the apparatus comprising:
   a processing vessel;
   a gas supply system configured to supply a gas into the processing vessel;
   a first electrode and a second electrode arranged with a space within the processing vessel therebetween;
   a high frequency power supply configured to output a high frequency power;
   a power feed line configured to connect the high frequency power supply to either one electrode of the first electrode and the second electrode;
   a matching device configured to adjust a load impedance of the high frequency power supply;
   an operation unit configured to calculate a parameter including any one of the load impedance, a load resistance and a load reactance of the high frequency power supply and a reflection wave coefficient of the high frequency power; and
   a controller configured to sequentially perform multiple cycles, each having plural stages which generate plasma of different processing gases within the processing vessel and which are performed in sequence,
   wherein the controller is further configured to control:
   the high frequency power to be supplied to the either one electrode from the high frequency power supply over the plural stages;
   changing the processing gas output from the gas supply system when transitioning from a preceding stage in the plural stages to a succeeding stage which continues to the preceding stage; and
   changing a setting of the high frequency power supplied to the either one electrode from the high frequency power supply at a time point when the parameter exceeds a threshold value after the processing gas output from the gas supply system is changed,
   wherein the changing of the setting of the high frequency power includes changing a power level of the high frequency power and/or changing the high frequency power, which is supplied to the either one electrode from the high frequency power supply, from one of a continuous wave and a pulse-modulated high frequency power to the other thereof.

2. The plasma processing apparatus of claim 1, further comprising a time adjusting unit configured to:
   calculate a time difference from when transitioning to the succeeding stage to the time point when the parameter exceeds the threshold value; and
   adjust a length of a preset processing time of the same stage as the succeeding stage in a cycle performed after a preceding cycle in the multiple cycles to be increased by the time difference obtained in the preceding cycle in the multiple cycles.

3. The plasma processing apparatus of claim 1,
   wherein the operation unit is further configured to adjust the threshold value by using a moving average value calculated from a series of parameter,
   wherein the series of parameter includes the parameter including any one of the load impedance, the load resistance and the load reactance of the high frequency power supply and the reflection wave coefficient of the high frequency power in a state that impedance matching by the matching device is completed in the same stage as the succeeding stage of the previously completed cycle in the multiple cycles or in each of the succeeding stage and the same stage as the succeeding stage of the previously completed cycle in the multiple cycles.

4. The plasma processing apparatus of claim 1,
   wherein the plural stages comprises:
   a first stage of generating plasma of a first processing gas containing a rare gas and a fluorocarbon gas; and
   a second stage of generating plasma of a second processing gas containing a rare gas, the second stage being performed subsequent to the first stage.

5. The plasma processing apparatus of claim 4,
   wherein the plural stages further comprises:
   a third stage of generating plasma of a third processing gas containing a rare gas and an oxygen gas, the third stage being performed subsequent to the second stage.

6. The plasma processing apparatus of claim 1,
   wherein each of the plural stages includes:
   a first sub-period which is a period ranging from the time point when the setting of the high frequency power or the level of the DC voltage is changed to a certain time point within a processing time of the each stage; and
   a second sub-period which is a period ranging from the certain time point to an end of the time point of the processing time of the each stage.

7. The plasma processing apparatus of claim 6, further comprising:
   an impedance sensor configured to calculate a first moving average value which is a moving average value of the load impedance of the high frequency power supply in the first-sub period, and a second moving average value which is a moving average value of the load impedance of the high frequency power supply in the second-period.

8. The plasma processing apparatus of claim 7,
   wherein the controller is further configured to determine whether the first and second moving average values are within a preset control range.

9. The plasma processing apparatus of claim 8,
   wherein the preset control range is a range in which the load impedance of the high frequency power supply is matched with a matching point through a control of a frequency of the high frequency power.

10. The plasma processing apparatus of claim 8,
    if the first and second moving average values are within a preset control range,
    wherein the controller is further configured to set the frequency of the high frequency power for each of the first and second sub-period such that the load impedance of the high frequency power supply in the first sub-period estimated from the first moving average value and the load impedance of the high frequency power supply in the second sub-period estimated from the second moving average value approximate to the matching point.

11. The plasma processing apparatus of claim 10,
    wherein the controller is further configured to set the power level of the high frequency power in the first and second sub-periods after setting the frequency of the high frequency power for each of the first and second sub-period.

12. The plasma processing apparatus of claim 11,
    wherein the controller is further configured to control the power level of the high frequency power in the first sub-period is higher than the power level of the high frequency power in the second sub-period.

13. The plasma processing apparatus of claim 8,
if the first and second moving average values are not within a preset control range,
wherein the controller is further configured to adjust the matching device such that the load impedance of the high frequency power supply approximates to the matching point.

14. A plasma processing apparatus for performing a plasma processing method, the apparatus comprising:
a processing vessel;
a gas supply system configured to supply a gas into the processing vessel;
a first electrode and a second electrode arranged with a space within the processing vessel therebetween;
a high frequency power supply configured to output a high frequency power;
a power feed line configured to connect the high frequency power supply to either one electrode of the first electrode and the second electrode;
a matching device configured to adjust a load impedance of the high frequency power supply;
a DC power supply connected to the first electrode and configured to generate a negative DC voltage;
an operation unit configured to calculate a parameter including any one of the load impedance, a load resistance of and a load reactance of the high frequency power supply and a reflection wave coefficient of the high frequency power; and
a controller configured to sequentially perform multiple cycles, each having plural stages which generate plasma of different processing gases within the processing vessel and which are performed in sequence,
wherein the controller is further configured to control:
the high frequency power to be supplied to the either one electrode from the high frequency power supply over the plural stages;
changing the processing gas output from the gas supply system when transitioning from a preceding stage in the plural stages to a succeeding stage which continues to the preceding stage; and
changing at least one of a setting of the high frequency power supplied to the either one electrode from the high frequency power supply and a level of the DC voltage output by the DC power supply at a time point when the parameter exceeds a threshold value after the processing gas output from the gas supply system is changed,
wherein the changing of the setting of the high frequency power includes changing a power level of the high frequency power and/or changing the high frequency power, which is supplied to the either one electrode from the high frequency power supply, from one of a continuous wave and a pulse-modulated high frequency power to the other thereof.

* * * * *